（12）United States Patent
Kim et al.

(10) Patent No.: US 8,594,141 B2
(45) Date of Patent: Nov. 26, 2013

(54) FEMTOSECOND LASER APPARATUS USING LASER DIODE OPTICAL PUMPING MODULE

(75) Inventors: Guang Hoon Kim, Busan (KR); Uk Kang, Seoul (KR); Ju Hee Yang, Seoul (KR); Elena Sall, Seoul (KR); Sergey Chizhov, Seoul (KR); Andrey Kulik, Seoul (KR)

(73) Assignee: Korea Electrotechnology Research Institute, Changwon (KR)

( * ) Notice: Subject to any disclaimer, the term of this patent is extended or adjusted under 35 U.S.C. 154(b) by 0 days.

(21) Appl. No.: 13/562,045

(22) Filed: Jul. 30, 2012

(65) Prior Publication Data

US 2013/0051411 A1 Feb. 28, 2013

(30) Foreign Application Priority Data

Aug. 22, 2011 (KR) ........................ 10-2011-0083563

(51) Int. Cl.
*H01S 3/098* (2006.01)

(52) U.S. Cl.
USPC .................. 372/18; 372/30; 372/34; 372/75; 372/107

(58) Field of Classification Search
USPC ................................. 372/18, 30, 34, 75, 107
See application file for complete search history.

(56) References Cited

U.S. PATENT DOCUMENTS

| 5,212,710 A * | 5/1993 | Kaneda et al. .................. 372/71 |
| 6,697,162 B1 * | 2/2004 | Sakai et al. .................... 356/500 |
| 2006/0120418 A1 * | 6/2006 | Harter et al. ................... 372/30 |

FOREIGN PATENT DOCUMENTS

| JP | 06-275889 A | 9/1994 |
| JP | 07-058377 A | 3/1995 |
| JP | 07-026085 U | 5/1995 |
| JP | 09-179155 A | 7/1997 |
| JP | 10-273124 A | 10/1998 |
| JP | 11-233855 A | 8/1999 |
| JP | 2001-108408 A | 4/2001 |
| JP | 2005-005627 A | 1/2005 |
| JP | 2006-256063 A | 9/2006 |
| KR | 1020100110109 A | 10/2010 |

\* cited by examiner

*Primary Examiner* — Kinam Park
(74) *Attorney, Agent, or Firm* — Patent Office of Dr. Chung Park

(57) ABSTRACT

The present invention provides a femtosecond laser apparatus using laser diode optical pumping. To provide a stable mode locking and improve power stability and beam stability in an ultrafast laser such as a femtosecond laser, optical mounts which have mounted thereon optical parts of a diode pumping unit are mechanically engaged using bars of low thermal expansion coefficients and form a pumping module, and the pumping module is maximally separated from a laser platform or case.

8 Claims, 12 Drawing Sheets

FEMTOSECOND LASER APPARATUS USING LASER DIODE OPTICAL PUMPING MODULE

CROSS-REFERENCE TO RELATED APPLICATION

This application claims under 35 U.S.C. §119(a) the benefit of Korean Patent Application No. 10-2011-0083563 filed Aug. 22, 2011, the entire contents of which are incorporated herein by reference.

BACKGROUND (a) Technical Field

The present disclosure relates to a diode-pumped laser apparatus. More particularly, it relates to a femtosecond laser apparatus using a laser diode optical pumping module, which can provide stable mode locking and can improve power stability and beam stability in a ultrafast laser.

(b) Background Art

In general, an ultrafast laser pulse has superior properties such as high peak power, a large spectral width, etc., as well as a short pulse time width.

The ultrafast laser system, due to such properties thereof, has been used for ultra-precision micromachining of various materials, non-linear optics, and bio, chemical, physical, and medical applications, and so forth.

For example, because of minimizing thermal diffusion in a processing region and causing no residual damage to the periphery, an ultrafast laser pulse of a femtosecond region can process a material which is too hard to be processed mechanically. And a non-linear optical effect which is multi-photon absorption based on high peak power, the ultrafast laser pulse can process a structure of various nano scales even for a transparent material such as glass, polymer, etc.

Laser stability indicates whether elements are maintained constant over time, in which the elements include power applied to an object to which a laser is to be applied, a position of a beam to be applied to the object, spatial traveling of the beam, a distribution pattern of the beam, and so forth.

When a laser has to be precisely applied to a target from a remote place, for example, like in laser processing, laser stability is very important.

In particular, for an ultrafast laser such as a femtosecond laser, laser stability is even more important in ultra-precision laser processing having nanometer-level precision.

Beam stability indicating whether or not the beam travels stably at predetermined position and angle in spatial terms is closely related to applications such as laser processing.

The characteristics of beam stability may be described with beam positional stability associated with a positional change in the form of a beam on an object and beam angular stability indicating an angular change when the beam is focused on the object.

Beam stability is typically called "beam pointing stability".

Factors affecting laser stability may include internal and external factors such as physical vibration, mechanical deformation, a change in thermal distribution, instability of a resonator, air flow, etc.

An ultrafast laser is especially sensitive to those internal and external factors, and thus, various efforts have been made to improve the stability of the laser.

In the ultrafast laser represented by a femtosecond laser, mode-locking is a method to obtain ultrashort pulses from a femtosecond oscillator. Because mode-locking is very sensitive to a minute change in an optical path, the oscillator is also very sensitive to mechanical deformation of optical mounts caused by a change in the ambient temperature, such that the output characteristics of the oscillator may sensitively change accordingly.

For this reason, most femtosecond lasers, for stable operation, are installed and operated in clean rooms having constant-temperature facilities for stably maintaining the ambient temperature within ±0.5° C.

However, a local temperature change inevitably occurs around optical mounts such as an optical pumping-related mount, a laser medium mount, etc., to which a high-power pumping light source is applied, or around a laser power device, a cooling device, etc., which emit much heat to outside due to a cooling pan thereof.

That is, the femtosecond laser is much affected in terms of its output characteristics by a local temperature change around optical parts included therein as well as a change in the ambient temperature around a space in which the laser is installed.

Therefore, it is very important that a femtosecond laser system is mechanically configured to be sensitive as less as possible to the temperature.

A conventional representative femtosecond laser is a laser which uses Ti-Sapphire as a medium.

The Ti-Sapphire medium may generate a very short pulse of up to several femtoseconds, because of having a large emission spectral band of 100 nanometers.

To pump energy from outside, a green light source from an Nd:YVO laser pumped by a high-power laser diode is strongly focused with a magnitude of several tens through several hundreds of micrometers to a Ti-Sapphire laser crystal.

The pumping light source is structurally spaced apart from Ti-Sapphire by several meters, such that to stably operate the Ti-Sapphire laser, the stability of the output characteristics of the pumping light source is very important.

For example, with poor pointing stability of the pumping light source, a spot position of the pumping light source focused strongly with a magnitude of several tens through several hundreds of micrometers in the Ti-Sapphire laser crystal changes inconstantly, such that mode coupling between the pumping light source and the laser beam continuously changes, degrading the laser power stability.

For instance, if characteristics such as output power, output beam direction, and so forth are deteriorated, the quality of a laser-processing product using the characteristics becomes also deteriorated.

To overcome the above problem, a reflecting mirror is installed on an optical mount having mounted thereon a control device capable of finely adjusting a beam direction. Therefore, the beam direction of the pumping light source can be controlled by the reflecting mirror, thereby controlling power stability.

However, when optical parts are simultaneously controlled to optimize stability, a system becomes large in size and complex in construction and the price of the system also increases.

Therefore, in general cases, a control device is mounted only one or two optical parts.

On the other hand, if an ultrafast pulse can be obtained by applying a high-power beam output from a semiconductor laser diode directly to a laser crystal, a problem that a conventional Ti-Sapphire laser needs an expensive pumping laser can be overcome. Then, such problems of price, size, and stability, which are disadvantages of the Ti-Sapphire laser, can be more easily solved.

In this case, if a high-power laser diode, which is a pumping light source, can be positioned close to the laser crystal within several tens of centimeters or several centimeters from the laser crystal, then the stability of the ultrafast laser can be further improved.

If an amplifier part used for improving the output power of the ultrafast laser can be pumped in a continuous-wave mode, instead of a pulse mode, by using the high-power laser diode, then the laser can be further stably operated.

When a femtosecond pulse is first generated in mode locking in a femtosecond oscillator, the energy of the pulse is very low of about nano Jule (nJ), and thus the pulse is not suitable for applications such as laser processing and the like.

To increase the energy of the femtosecond pulse, the technique of chirped pulse amplification (CPA) is used.

A pulse output from a femtosecond oscillator is temporally stretched and then applied to an amplifier, thus being used as a seeding pulse.

In a laser crystal of the femtosecond amplifier, stable coupling between the seeding pulse and an amplifier/resonator mode is very important for the stability of the femtosecond amplifier.

Therefore, in a system having an amplifier in the femtosecond laser, the stability of an oscillator becomes more important.

Another way to increase the stability of the femtosecond laser is manufacturing a laser case by excavating the inside of a single aluminum block, in which other portions than an upper cover are manufactured integrally as one piece to minimize mechanical deformation of the case due to the temperature change.

Also, in an effort to reduce the temperature change, a module having a high-power diode mounted thereon or a module having a laser crystal mounted thereon is manufactured with copper having superior heat conductivity, and cooling water of a constant temperature is let flow.

To further improve the stability, a cooling water line, as well as the above-described modules, may be provided in the laser case to let the cooling water flow, thus minimizing the temperature change.

However, for example, it can be often seen that, if the laser is operated and used, and after being powered-off, the laser is powered on again for operation on the next day, then the characteristics of the laser are deteriorated.

This is because mechanical deformation occurring during power-off is not completely restored by the cooling device even after power-on.

To overcome this problem, in some common femtosecond laser system, it is recommended that the laser system such as a pumping light source, a cooling device including cooling water, etc., be operated throughout 24 hours to maintain a stable state.

However, it is not easy to maintain optical mounts of a laser resonator at a constant temperature.

To reduce a change in power of the femtosecond laser over time, a spatial change of a beam including pointing stability, or the like, mode coupling for spatially matching the pumping light source applied from outside to the beam in the laser crystal inside the resonator should be maintained stably.

If the pumping light source applied from outside is far from the laser crystal, it is not easy to stably maintain the mode coupling due to the beam stability of the pumping light source.

Therefore, to manufacture a femtosecond laser of high stability, it is desirable to apply a laser diode, as a pumping light source, directly to the laser crystal at close range.

Since the high-power pumping light source is applied from outside and the high-power laser beam is generated inside the laser resonator, the high power is delivered in the form of heat to optical mounts with which optical parts, e.g., the laser crystal, the optical mirror, etc., are engaged, and also to a laser platform and the laser.

The delivered heat causes mechanical deformation of an optical mount or the like, and the mechanical deformation minutely changes the direction of an optical part, such that the arrangement of the laser resonator is disturbed, degrading the output characteristics of the laser.

In particular, in the ultrafast laser such as the femtosecond laser, a mode locking phenomenon is used to generate a femtosecond pulse, and since mode locking is very sensitive to deformation of the resonator, the stability of the femtosecond pulse is degraded, and finally, mode locking is not maintained any more, such that the femtosecond pulse may not be even generated any more.

For example, the form of a femtosecond laser implemented as a test is shown in an optical conceptual diagram of FIG. 1.

In FIG. 1, an LC indicates a laser crystal, M1 through M6 indicate reflecting mirrors, SAM indicates a saturable absorber mirror, DM indicates a dichroic mirror, OC indicates an output coupler, LD indicates a laser diode, WP indicates a half-wave plate, CL indicates a collimating lens, and FL indicates a focusing lens, respectively.

In FIG. 1, a dotted-line block indicates an optical pumping unit of laser diode.

Conventionally, to realize the optical conceptual diagram in this form, optical parts like respective reflecting mirrors are independently mounted on optical mounts and are fixed to a laser platform.

More specifically, FIG. 2 shows a device which realizes the dotted-line block of FIG. 1, in which energy is optically provided from outside of the laser resonator to the laser crystal inside the resonator by using the high-power laser diode.

Herein, a reference numeral 100 indicates an optical fiber, reference numerals 110a through 110f indicate respective mounts for mounting the optical fiber, the half-wave plate, the collimating lens, the focusing lens, and the dichroic mirror thereon, and reference numerals 120a through 120g indicate mount blocks installed on a laser platform 130 to support the respective mounts.

When a high-power diode output beam passes through various optical parts, some portion thereof is reflected and hit on various mechanical parts or a laser case.

Then, as the high-power pumping beam is absorbed in some optical mounts, thermal distribution in the laser becomes non-uniform, resulting in local heating, such that the respective mounts are independently deformed and thus, the arrangement of the resonator of the laser becomes poor.

As such, if much deformation occurs, mode locking for generating the femtosecond laser pulse in the femtosecond laser is not maintained any more, and thus the femtosecond pulse is not generated any more and a continuous wave of a very low peak power is generated.

In this case, a mode-locking starter has to be operated to generate mode locking again, such that mode locking is generated and the femtosecond laser pulse is generated again.

If the laser, although having been mode-locked, is left powered-off for a long time, the laser is thermally cooled down and returns to the thermal equilibrium state.

However, if the laser is powered on again, thermal imbalance occurs again, causing mechanical deformation.

However, since the laser does not completely return to the previous state, mode locking is often broken.

FIG. 3 shows a change in power over time when the femtosecond laser starts operating in a state where optical mounts of an optical pumping unit are mounted independently.

FIG. 3 shows the case when the laser is powered on again after the laser, which was operated previously to stably generate the femtosecond laser pulse, was powered off to cool completely.

As can been seen, although mode locking of the femtosecond laser was stable, if the laser is powered on again, mode locking is often broken and thus a continuous wave (CW) is generated. As a result, the mode-locking starter has to be operated for mode locking of the laser.

The above information disclosed in this Background section is only for enhancement of understanding of the background of the invention and therefore it may contain information that does not form the prior art that is already known in this country to a person of ordinary skill in the art.

SUMMARY OF THE DISCLOSURE

Accordingly, the present invention has been made in an effort to solve the above-described problems associated with prior art, and provides an apparatus in which to provide stable mode locking in an ultrafast laser and improve power stability and beam stability, optical mounts which have mounted thereon optical parts of the diode pumping unit are mechanically engaged using bars of low thermal expansion coefficients and form a pumping module, and the pumping module is maximally separated from a laser platform or case.

To achieve the foregoing object, the femtosecond laser apparatus using the laser diode optical pumping module provided in the present invention has the following characteristics.

The femtosecond laser apparatus using laser diode optical pumping mechanically engages the optical mounts having mounted thereon the optical parts of the diode pumping unit by using bars of low thermal expansion coefficients, thus forming the pumping module, and maximally separates the formed pumping module from the laser platform or case, thereby providing stable mode locking in the ultrafast laser and improving power stability and beam stability.

More specifically, the optical mounts, which are mechanically deformed by being locally heated due to the high-brightness pumping light source in the femtosecond laser, are mechanically engaged to be modularized in an integrated manner.

For modularization, invar is used whose mechanical thermal expansion coefficient with respect to the temperature change is almost zero.

In addition, by minimizing contact between the module and the laser platform or case, delivery of external thermal deformation to the module is minimized.

Moreover, mode coupling between the pumping light source focused in the laser crystal and the laser resonator mode is stably maintained by mechanically stabilizing the optical pumping module with respect to the temperature change, thereby improving the power stability and the beam stability of the laser.

Invar is known generally as FeNi36, and as 64FeNi in the U.S., which is an alloy of nickel, iron, etc., and is famous for its low thermal expansion coefficient.

The name "invar" also originates from "invariant" which means that it does not particularly expand or contract with respect to the temperature change.

Invar has a thermal expansion coefficient of about $1.2 \times 10^{-6}$/K or less at room temperature.

Such a coefficient means that a mechanical value changes by only about 1/1000000 with respect to a temperature change of 1° C.

Due to the above-described thermal characteristics, invar is used when a high dimensional stability is required as in precision tools, clocks, and so forth.

Various types of invar materials, such as invar, super invar, kovar, etc., are available in the market, though there is some difference in thermal expansion coefficients with chemical compositions.

Other aspects and preferred embodiments of the invention are discussed infra.

The above and other features of the invention are discussed infra.

BRIEF DESCRIPTION OF THE DRAWINGS

The above and other features of the present invention will now be described in detail with reference to a certain exemplary embodiment thereof illustrated the accompanying drawings which are given hereinbelow by way of illustration only, and thus are not limitative of the present invention, and wherein.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

DETAILED DESCRIPTION

Hereinafter reference will now be made in detail to an embodiment of the present invention, examples of which are illustrated in the accompanying drawings and described below. While the invention will be described in conjunction with the exemplary embodiment, it will be understood that present description is not intended to limit the invention to the exemplary embodiment. On the contrary, the invention is intended to cover not only the exemplary embodiment, but also various alternatives, modifications, equivalents and other embodiments, which may be included within the spirit and scope of the invention as defined by the appended claims.

Hereinafter, the present invention will be described in detail with reference to the accompanying drawings.

Figure 4:
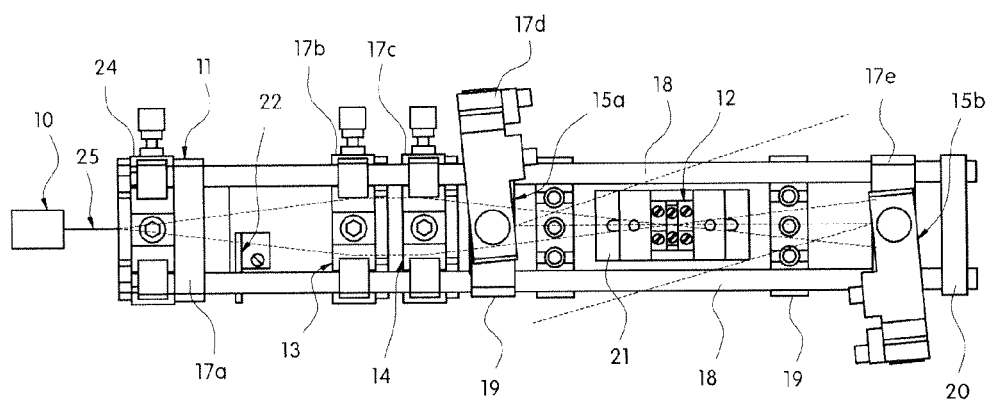
FIG. 4 shows a front view and a plane view of an optical pumping unit in which optical mounts are modularized as one piece, according to the present invention.
Figure 4:
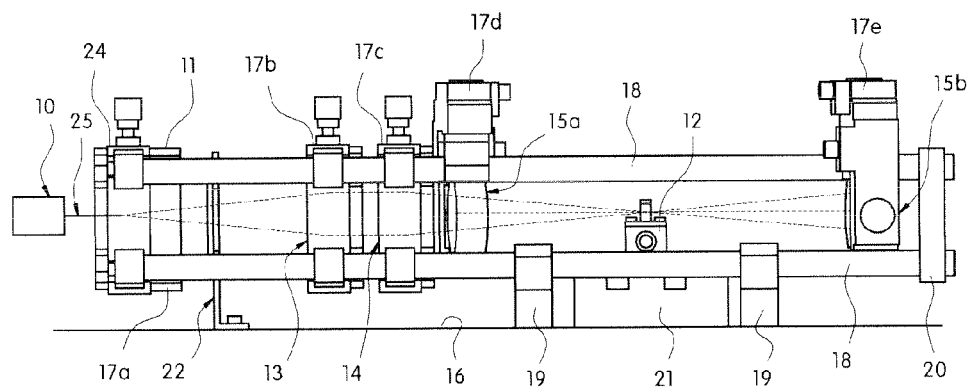

FIG. 4 shows a front view and a plane view of an optical pumping unit in which optical mounts are modularized as one piece, according to the present invention.

As shown in FIG. 4, a femtosecond laser apparatus according to the present invention may include an optical pumping module in which optical parts forming a diode pumping unit and mounts for mounting the optical parts are modularized as one piece by using bars of low thermal expansion coefficients, i.e., a plurality of module coupling bars 18, and a minimum number of module couplers 19, such that the optical pumping module is installed spaced apart from a laser platform 16, e.g., installed in a position spaced apart by a predetermined distance (height) from the laser platform 16.

To this end, a laser diode 10 as a pumping light source, a half-wave plate 11 for adjusting a polarization direction of a pumping light source, a collimating lens 13 and a focusing lens 14 for efficiently applying an output beam of the laser diode 10 to a laser crystal 12 and improving mode coupling, the laser crystal 12 for focusing the pumping light source, and dichroic mirrors 15a and 15b for reflecting a laser beam and passing the pumping light source therethrough are provided, and these optical parts are arranged in a line sequentially in order of the half-wave plate 11, the collimating lens 13, the focusing lens 14, and then the laser crystal 12, and the dichroic mirrors 15a and 15b are disposed in front of and behind the laser crystal 12.

In particular, respective optical parts, e.g., the half-wave plate 11, the collimating lens 13, the focusing lens 14, and the dichroic mirrors 15a and 15b are mounted on and supported by respective mounts 17a through 17(e) and the respective mounts 17a through 17e are coupled as one piece by the plurality of module coupling bars 18, preferably, two through four module coupling bars 18.

That is, the module coupling bars 18 are engaged by horizontally penetrating the respective mounts 17a through 17e at the same time, such that all of the mounts 17a through 17e having optical parts mounted thereon are coupled as one piece.

The module coupling bars 18 may be invar, super invar, or kovar which has a low thermal expansion coefficient.

All the module coupling bars 18 including the optical parts and the respective mounts 17a through 17e are engaged and supported on at least one module coupler 19 installed on the laser platform 16.

Figure 6:
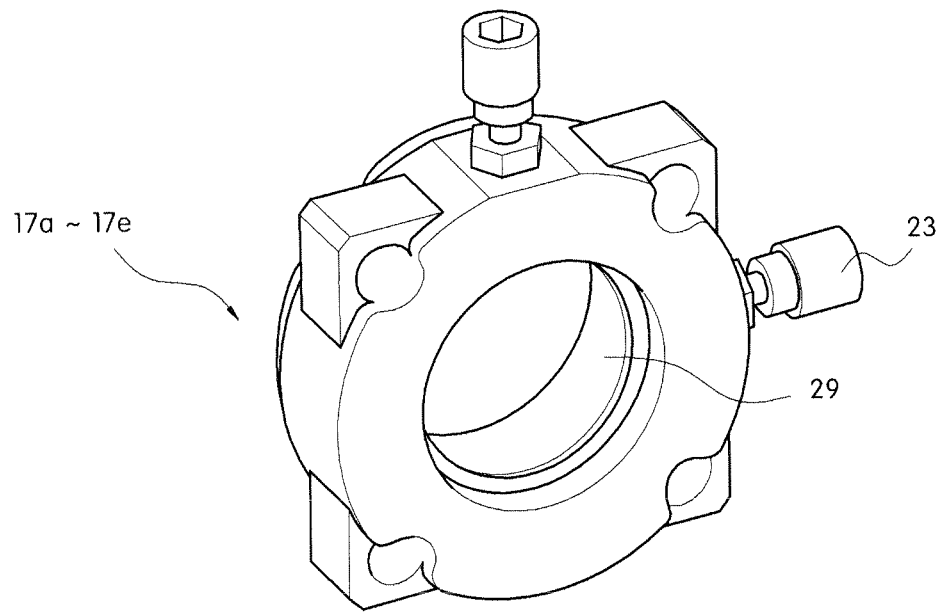
FIG. 6 is a perspective view showing an engagement-type optical mount in an optical pumping unit in which optical mounts are modularized as one piece, according to the present invention.

Herein, each of the mounts 17a through 17e, as shown in FIG. 6, may be in the form of a ring-shaped block having an optical part seating portion 29 for receiving an optical part and a position adjusting screw 23 for precisely and minutely adjusting a position of the optical part received in the optical part seating portion 29. Each of the mounts 17a through 17e is provided with two through four holes for passing the module coupling bars 18 therethrough.

Figure 5:
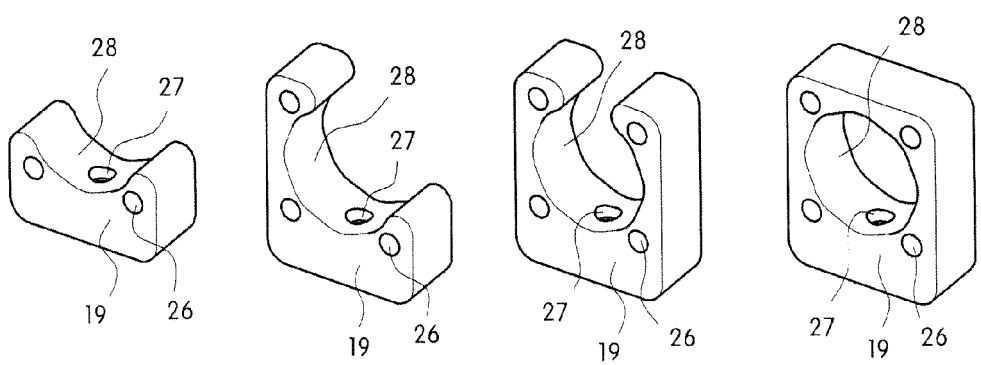
FIG. 5 is a perspective view showing various module couplers in an optical pumping unit in which optical mounts are modularized as one piece, according to the present invention.

The module coupler 19 may also have various forms, and for example, as shown in FIG. 5, they may have various forms having a mount seating portion 28 of an open or closed type and two through four through-holes 26 for passing the module coupling bars 18 therethrough.

Herein, a reference numeral 27, which is not described, indicates a screw hole used to mount the module coupler 19 on the laser platform 16.

The optical pumping module, when viewed generally, may have an asymmetric shape because optical parts are intensively positioned in a front-end side, and to solve this problem, that is, to globally stabilize the optical pumping module, an auxiliary adaptor 20 is provided, which is coupled on the module coupling bar 18 in an opposite end to the half-wave plate 11 by means of a screw engagement structure or the like.

The laser crystal 12 interposed between the dichroic mirrors 15a and 15b is installed directly on the laser platform 16 by means of a laser crystal mount 21.

That is, the laser crystal mount 21 of the laser crystal 12 is installed directly on the laser platform 16, instead of being coupled on the module coupling bar 18.

In a rear-end side of the half-wave plate 11 is positioned a reflected beam blocker 22 which prevents the mount 17a having the half-wave plate 11 mounted thereon from being heated by a high-brightness beam reflected by the dichroic mirrors 15a and 15b. The reflected beam blocker 22 is installed on the laser platform 16.

In particular, an optical fiber 25, which extends from the laser diode 10 and is connected toward the half-wave plate 11, is provided, and an end portion thereof is connected and installed in a way to be supported by an optical fiber mount 24 coupled on the module coupling bars 18.

MODE FOR CARRYING OUT THE INVENTION

Figure 1:
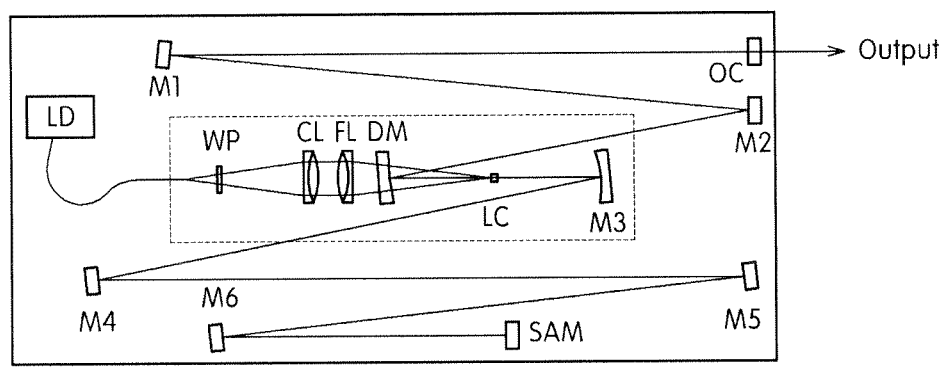
FIG. 1 is a schematic diagram of optical concept of a femtosecond laser.

The form of a femtosecond laser implemented as a test to carry out the present invention is as shown in the optical conceptual diagram of FIG. 1.

A laser crystal LC used in this test uses Yb:KYW having 5%-doped ytterbium ion, $Yb^{3+}$ ion and a size of $3\times3\times3$ $mm^3$.

Yb:KYW, which is an anisotropic laser crystal, has different absorbance according to traveling direction and polarization direction of a pumped beam.

To maximize an absorbance of a pumping light source, the laser crystal was cut such that the polarization direction of the pumping light source was made parallel to an a-axis of the laser crystal and the pumping light source traveled in the direction of a b-axis of the laser crystal, and the laser crystal was anti-reflection coated on its both surfaces to minimize reflection with respect to a pumping light source wavelength and a laser wavelength.

A concave dichroic mirror DM having a radius of curvature of 100 mm was disposed to reflect the laser beam and pass the pumping light source therethrough.

In order for a femtosecond laser resonator to generate a shorter pulse than 1 pico second, dispersion occurring in an optical part included in the laser resonator has to be corrected.

Generally, a prism delay line or chirped mirror is used to compensate the dispersion. Unlike in the prism delay line which uses two prisms together as a pair, in case of the chirped mirror, the dispersion compensation is determined by a dispersion value of the chirped mirror itself, rather than a distance to an optical part, such that the femtosecond laser can be structured compactly.

In this case, two chirped reflecting mirrors were used in the resonator and a total group-velocity dispersion in a single pass was GVD=−1350 fs$^2$.

To convert the femtosecond laser oscillated by a continuous wave CW into a laser which generates a mode-locked femtosecond pulse, a semiconductor saturable-absorber mirror SAM was disposed at an end portion of the laser resonator.

To obtain a strength exceeding a saturable strength of an absorber, a concave reflex mirror having a radius of curvature of 300 mm was used and the beam was focused on the surface of the semiconductor saturable-absorber mirror SAM.

An absorbance of the used semiconductor saturable-absorber mirror SAM was 3%.

As a pumping light source, a laser diode LD having a maximum power of 8 W was used.

The laser diode was mounted on a copper block having a Peltier thermoelectric device mounted thereon, and the copper block is controlled such that the temperature thereof is maintained constant by a cooler in which cooling water of a predetermined temperature is circulated.

As such, the temperature of the laser diode was controlled such that the wavelength allows the maximum absorption of the pumping light source in the laser crystal.

To improve the pumping efficiency, the length of the optical fiber engaged to the laser diode is short of about 80-120 mm, preferably about 100 mm, thus acquiring a linear-polarized beam with a depolarization rate of about 7%.

To efficiently apply an output beam of the high-power laser diode to which the optical fiber having a core diameter of 100-110 μm, preferably 105 μm, and a numerical aperture of 0.11 is applied. And in order to improve mode coupling, a collimating lens CL and a focusing lens FL, which have focal lengths of 60 mm, respectively, are used for optimization.

A transverse beam of the pumping light source focused in the laser crystal is of a diameter of about 100 μm, thus being well matched to the size of a resonator mode made in the laser crystal.

Since the absorbance of the pumping light source in the current laser crystal varies with the polarization direction of the pumping light source, a half-wave plate WP mounted on a rotation mount is disposed behind the end of the optical fiber in advance to minutely adjust the polarization direction of the pumping light source, thus maximizing the optical pumping efficiency.

In the current test according to the present invention, the optical pumping unit includes a laser diode end, the half-wave plate WP, the collimating lens CL, the focusing lens FL, the dichroic mirror DM, and the reflecting mirror M3.

Figure 2:
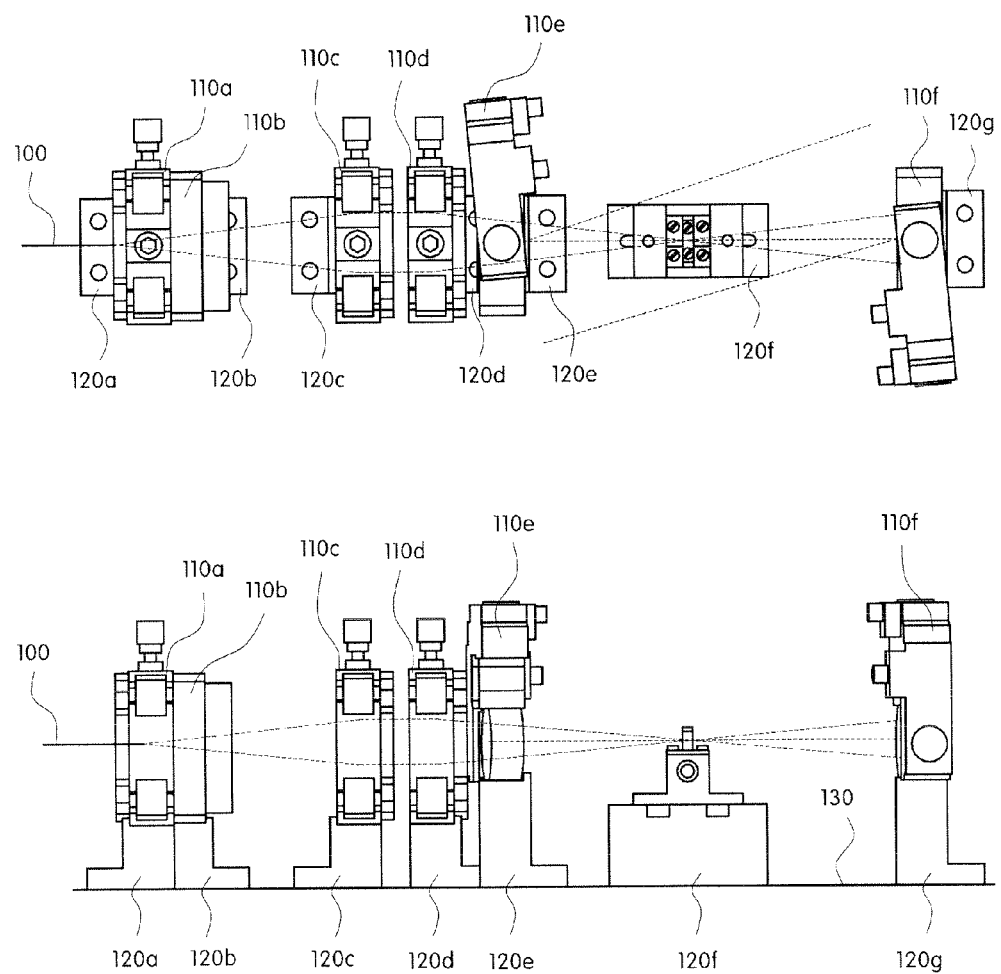
FIG. 2 shows a front view and a plane view of an optical pumping unit in which conventional optical mounts are independently mounted.

While the optical mounts having the optical parts of the optical pumping unit mounted thereon are independently fixed on the laser platform in FIG. 2, the optical mounts having the optical parts of the optical pumping unit mounted thereon are mechanically engaged by the module coupling bars in FIG. 4.

When the mount module is configured by mechanical engagement as in FIG. 4, to make the mount module independent of mechanical deformation of an outer side or the laser platform, a module coupler is manufactured and the module coupling bar is engaged thereto, and engagement-type mounts in the forms as shown in FIG. 5 for engagement of the module coupling bar are mounted on the laser platform.

The module coupler is a tool for connecting the integrated-type optical pumping module with the laser platform, and the number of module couplers is preferably minimum, considering the stability of the optical pumping module.

In the current example, two module couplers have been used as shown in FIG. 4.

In the current example, the engagement-type mounts of the laser diode end portion, the half-wave plate, the collimating lens, the focusing lens, the dichroic mirror, and the reflecting mirror of the optical pumping unit were mounted.

For further global stabilization of asymmetric disposition of the integrated-type optical pumping module with respect to the laser resonator, the auxiliary adaptor was additionally disposed in the opposite end.

Herein, most parts of the diode pumping beam were absorbed in the laser crystal, and the remaining parts were delivered to the laser crystal mount in the form of heat, such that the laser crystal mount was separated from the optical pumping module and mounted directly on the laser platform.

Since much heat is delivered, the laser crystal mount is cooled by letting cooling water cooled to a predetermined temperature flow through a cooler connected with the laser.

As a high-brightness beam is reflected from the dichroic mirror of the resonator of the laser, it reaches the engagement-type mount of the half-wave plate and thus local heating occurs, resulting in poor mechanical stability with respect to thermal deformation.

Figure 7:
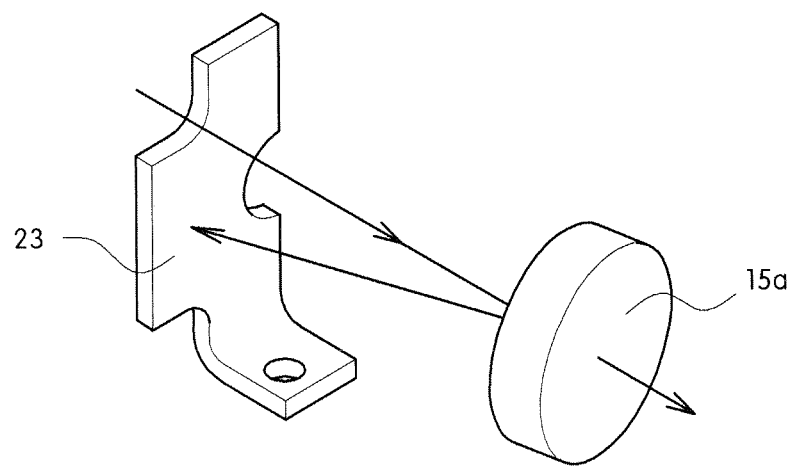
FIG. 7 is a perspective view showing a reflected beam blocker in an optical pumping unit in which optical mounts are modularized as one piece, according to the present invention.

To prevent such a phenomenon, the reflected-beam blocker as shown in FIG. 7 is separately manufactured and is mounted directly on the laser platform, rather than on the optical pumping module.

To sump up, in the present invention, in order to provide stable mode locking in the ultrafast laser and improve power stability and beam stability, mounts having mounted thereon optical parts of the diode pumping unit were mechanically engaged by using bars of low thermal expansion coefficients, thus forming the optical pumping module, and the optical pumping module was maximally separated from the laser platform or case.

More specifically, the mounts which are mechanically deformed by being locally heated by the high-strength pumping light source in the femtosecond laser are mechanically engaged for integrated-type modularization, and for modularization, invar whose mechanical thermal expansion coefficient is almost zero with respect to a temperature change is used.

In addition, by minimizing contact between the module and the laser platform or case, delivery of external thermal deformation to the module is also minimized.

Moreover, mode coupling between the pumping light source focused in the laser crystal and the laser resonator mode is stably maintained by mechanically stabilizing the optical pumping module with respect to the temperature change, thereby improving the power stability and the beam stability of the laser.

The following effects may be obtained from the optical pumping module.

To oscillate the femtosecond laser, first, a total reflecting mirror was disposed in place of a semiconductor saturable absorber to oscillate the laser as a continuous wave, and optical arrangement was optimized, after which to oscillate the femtosecond pulse, the total reflecting mirror was replaced with the semiconductor saturable absorber, and thus mode locking was generated.

The femtosecodn pulse operated at a repetition rate of 87.8 MHz, energy per pulse was 10 nano Jule or more, and an average power was about 1 W.

FIGS. 8 through 12 show measurement results of output characteristics of the femtosecond pulse when thermal deformation is minimized through integrated-type modularization of the optical pumping unit in the femtosecond laser.

Figure 8:
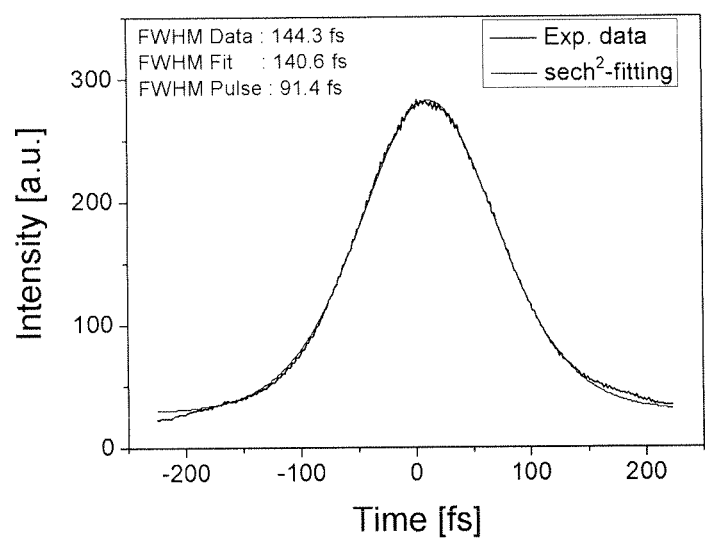
FIG. 8 is a graph showing a feature (pulse width) of a femtosecond pulse according to the present invention.
Figure 9:
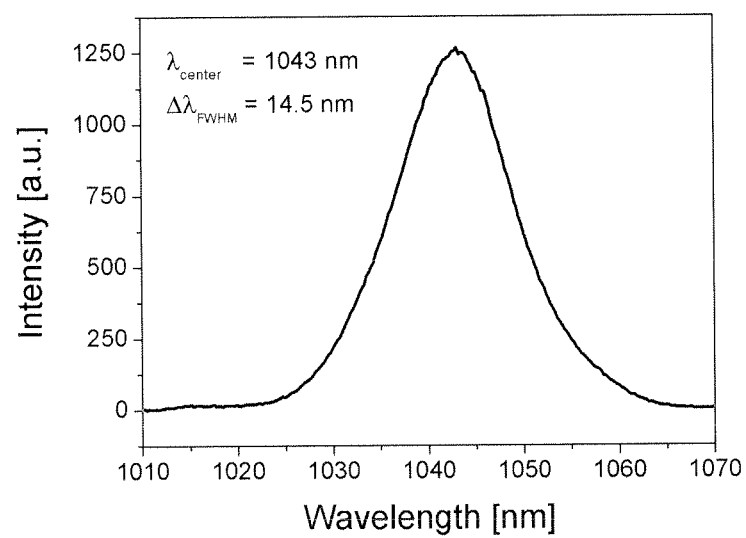
FIG. 9 is a graph showing a feature (spectrum) of a femtosecond pulse according to the present invention.

FIG. 8 shows a measurement result of a time width of a femtosecond laser pulse, in which a full width at half maximum (FWHM) was 91.4 femtosecond and a spectrum was of an FWHM of 14.5 nanometer with central wavelength of 1043 nanometer as shown in FIG. 9.

A pulse width-band width product indicating the characteristics of the femtosecond pulse was measured as $\Delta v \Delta \tau = 0.372$.

If the femtosecond pulse is in the shape of a hyperbolic function in a sech$^2$ form, the product is 0.315.

Figure 10:
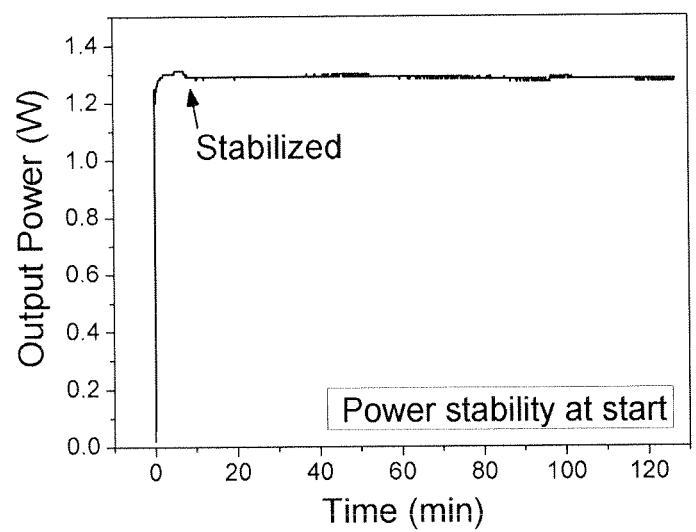
FIG. 10 is a graph showing a change in output power over time at start of operations of a femtosecond laser to which an optical pumping unit having optical mounts modularized as one piece thereon is applied, according to the present invention.

FIG. 10 shows a change in output power over time at start of a laser operation in a femtosecond laser to which an optical pumping module is applied in which mounts of an optical pumping unit are modularized in an integrated manner by using module coupling bars.

Figure 3:
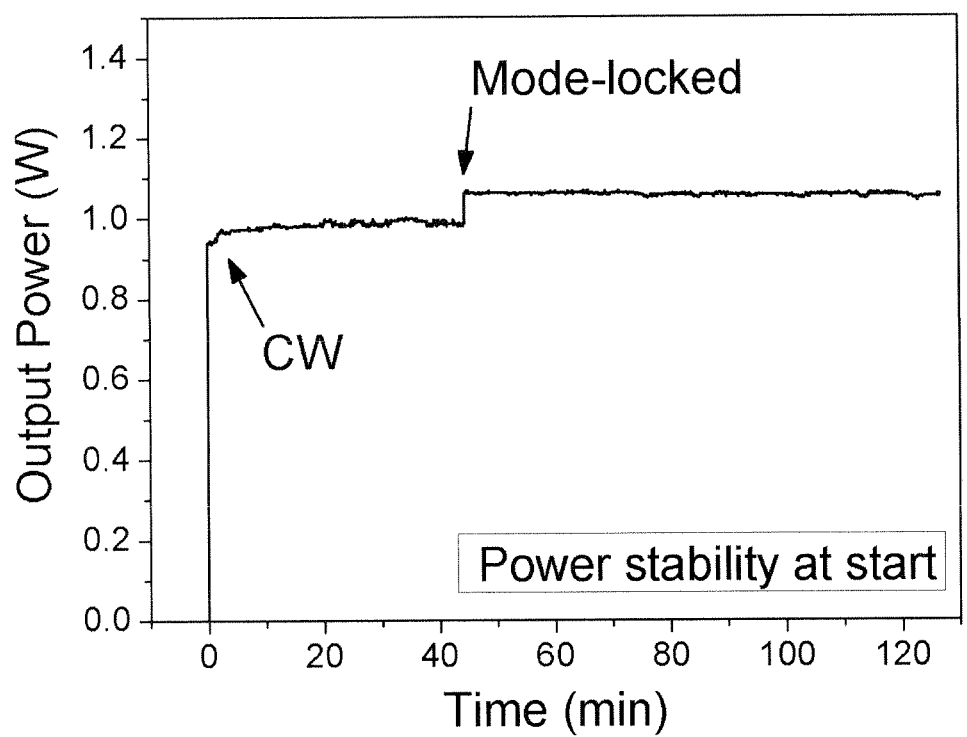
FIG. 3 is a graph showing a change in power over time at start of operations of a femtosecond laser to which an optical pumping unit having independently mounted conventional optical mounts thereon is applied.

FIG. 10, like FIG. 3, shows the case when the laser is powered on again which was operated previously to stably generate the femtosecond laser pulse, was powered off to cool completely.

It can be seen that the result of FIG. 10, which uses the integrated-type modularized optical pumping unit, very stably operates unlike in FIG. 3 in which mounts are independently mounted.

In FIG. 3, mode locking is broken, such that the mode-locking starter has to be operated; whereas in FIG. 10, the laser, even if being powered on again, is stabilized within several minutes and thus mode locking is maintained.

In addition, a change in output power over time is more stable in FIG. 10 than in FIG. 3.

The integrated-type optical pumping module implemented in the current test realizes optical pumping in a longitudinal direction with respect to the laser crystal by using a single laser diode.

Extending from this feature, higher power may be applied symmetrically in different directions with respect to the laser crystal by using two laser diodes.

In this case, one optical pumping unit may form an optical pumping module, such that two optical pumping modules may be disposed on both sides of the laser crystal, or module coupling bars may be extended to form one optical pumping module with two optical pumping units.

For mechanical stability of the laser platform, a module coupler may be additionally disposed.

When the laser is formed using two or more laser crystals, a more number of optical pumping modules may be used or an integrated-type optical pumping module may be extended.

In the current test according to the present invention, the stability of the femtosecond laser beam was more specifically measured.

The beam stability may be represented by beam positional stability and beam pointing stability.

The beam positional stability indicates how much the position of a laser beam changes on a surface where a target is positioned when the laser beam is delivered to the target.

The beam positional stability is an index indicating how much accurately the laser beam hits the target when the target is positioned a long distance from the laser, and thus is very important.

The beam pointing stability indicates how much the direction of focusing changes when the laser beam is focused in small size by using a lens having a short focal length.

The beam pointing stability is of importance because it is an index affecting the precision of a laser processing result when a high-strength beam is focused onto a processing product, such as a metallic material, a non-metallic material, etc., like in laser processing.

The center of the laser beam is defined as a centroid of a power density distribution or a primary space moment.

The traveling direction of the beam, a z axis, is a straight line connecting two centroids measured at the same time in two planes of a homogenous medium. The beam stability may be described in terms of features with beam positional stability indicating transverse displacement of x axis and y axis with respect to the beam traveling direction, the z axis, and beam angular stability indicating angular change.

A beam profiler embedded therein a CCD is disposed 1000 mm away from the laser, and a change in beam centroid is measured, such that a relative beam positional stability $\Delta_{rel}$ is indicated as $\Delta_{rel} = 2\Sigma/D$ with a beam diameter D and a position standard deviation $\Sigma$.

A lens having a focal length of 12 mm is disposed in a position 750 mm away from the laser, and a beam profiler having embedded therein a CCD is disposed on a focusing surface, and a change in the beam centroid is measured, such that relative beam pointing stability $\delta_{rel}$ is indicated as $\delta_{rel} = 2\sigma/d$ with a beam diameter d and a position standard deviation $\sigma$.

Figure 11:
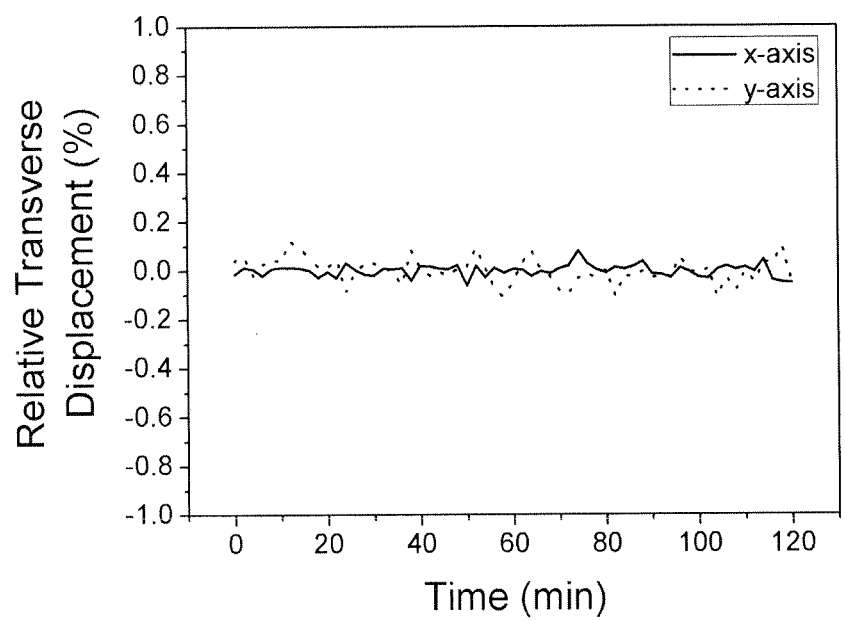
FIG. 11 is a graph showing a relative change in beam position over time according to the present invention.

FIG. 11 shows a result of experimentally measuring a change in relative beam position over time, i.e., beam positional stability, in which it can be seen that a beam positional stability is less than 0.1%.

That is, in a position far away from the laser, the beam positional change is 0.1% or less with respect to the beam size.

Figure 12:
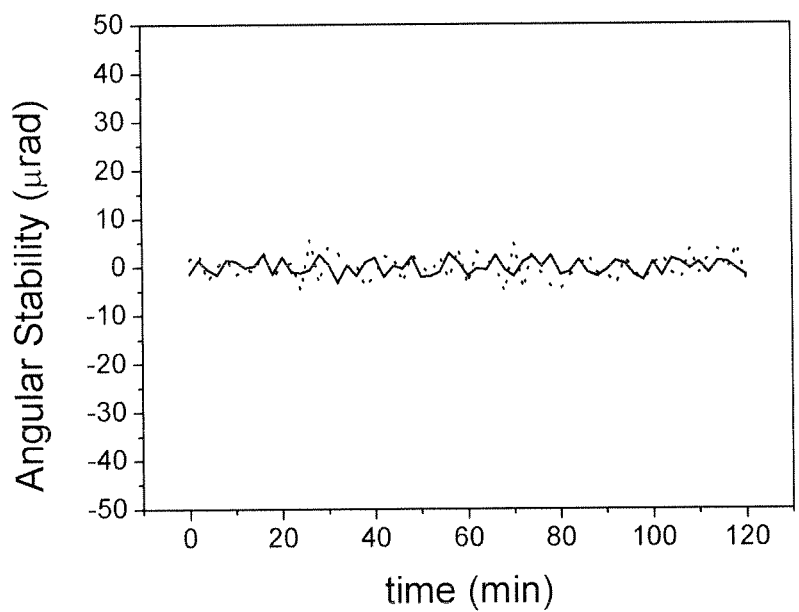
FIG. 12 is a graph showing a beam pointing change according to the present invention.

FIG. 12 shows a result of experimentally measuring a change in beam pointing over time, i.e., beam pointing stability, in which it can be seen that a beam pointing stability is very low of about 0.4 μrad in the x-axis direction, and is about 0.7 μrad in the y-axis direction.

Considering that a common laser having superior beam pointing stability has a beam pointing stability of 2-5 μrad, the test result realized with the embodiment of the present invention is very excellent.

The femtosecond laser apparatus using the laser diode optical pumping module according to the present invention has the following advantages.

Optical mounts for mounting optical parts are modularized in an integrated manner and at the same time, the modularized optical pumping module is separated from the laser platform or case to minimize contact between the module and the laser platform or case, thereby minimizing external thermal deformation delivered to the optical pumping module and thus stabilizing the optical pumping module, thereby improving stability of laser power and stability of the beam.

Moreover, through mechanical engagement using bars of low thermal expansion coefficients in integration of the optical pumping module, mechanical deformation due to an influence of temperature change can be minimized.

The invention has been described in detail with reference to a preferred embodiment thereof. However, it will be appreciated by those skilled in the art that changes may be made in the embodiment without departing from the principles and spirit of the invention, the scope of which is defined in the appended claims and their equivalents.

What is claimed is:

1. A femtosecond laser apparatus using a laser diode optical pumping module, the femtosecond laser apparatus comprising:

a laser diode for pumping a light source;
a half-wave plate for adjusting polarizing directions of pumping light sources arranged in sequence;
a collimating lens and a focusing lens for effectively applying an output beam of the laser diode to a laser crystal and improving mode coupling;
the laser crystal for focusing the pumping light sources; and
dichroic mirrors disposed in front of and behind the laser crystal to reflect a laser beam and transmit the pumping light sources therethrough,
wherein the half-wave plate, the collimating lens, the focusing lens, and the dichroic mirrors are integrated as one piece in the form of an optical pumping module through mechanical engagement, such that the optical pumping module is installed in a way to be separated from a laser platform.

2. The femtosecond laser apparatus of claim 1, wherein the optical pumping module comprises:
mounts for mounting the half-wave plate, the collimating lens, the focusing lens, and the dichroic mirrors thereon, respectively;
a plurality of module coupling rods for coupling the mounts in an integrated manner by horizontally penetrating the mounts; and
at least one module coupler installed on the laser platform and engaged with the module coupling rods to support the module coupling rods.

3. The femtosecond laser apparatus of claim 1, further comprising an auxiliary adaptor coupled to the module coupling rods at an end opposite to the half-wave plate to globally stabilize the optical pumping module in association with asymmetric arrangement of the optical pumping module.

4. The femtosecond laser apparatus of claim 1, wherein the laser crystal is installed directly on the laser platform by a laser crystal mount.

5. The femtosecond laser apparatus of claim 1, further comprising a reflected-beam blocker positioned behind a rear end side of the half-wave plate and installed on the laser platform to prevent the mount having the half-wave plate mounted thereon from being heated by a high-brightness beam reflected by the dichroic mirrors.

6. The femtosecond laser apparatus of claim 1, wherein each of the plurality of module coupling rods is formed of one of invar, super invar, and kovar which have low thermal expansion coefficients.

7. The femtosecond laser apparatus of claim 1, further comprising an optical fiber which is connected between the laser diode and the half-wave plate and whose end portion is supported by an optical fiber mount coupled on the module coupling rods, and the optical fiber is formed of an optical fiber which has a length of 80-120 mm, a core diameter of 100-100 µm, and a numerical aperture of 0.11.

8. The femtosecond laser apparatus of claim 1, wherein if two laser diodes are used, then one optical pumping unit forms an optical pumping module and two optical modules formed in this way are disposed at both sides of the laser crystal for use.

* * * * *